(12) United States Patent
Liu et al.

(10) Patent No.: US 7,271,206 B2
(45) Date of Patent: *Sep. 18, 2007

(54) ORGANIC-INORGANIC HYBRID COMPOSITIONS WITH SUFFICIENT FLEXIBILITY, HIGH DIELECTRIC CONSTANT AND HIGH THERMAL STABILITY, AND CURED COMPOSITIONS THEREOF

(75) Inventors: Shur-Fen Liu, Hsinchu (TW); Meng-Huei Chen, Hsinchu (TW); Jinn-Shing King, Hsinchu (TW)

(73) Assignee: Industrial Technology Research Institute, Chutung (TW)

( * ) Notice: Subject to any disclaimer, the term of this patent is extended or adjusted under 35 U.S.C. 154(b) by 351 days.

This patent is subject to a terminal disclaimer.

(21) Appl. No.: 11/003,411

(22) Filed: Dec. 6, 2004

(65) Prior Publication Data

US 2005/0154092 A1    Jul. 14, 2005

Related U.S. Application Data

(63) Continuation-in-part of application No. 10/742,815, filed on Dec. 23, 2003, now Pat. No. 7,008,981.

(51) Int. Cl.
*C08L 63/00* (2006.01)
(52) U.S. Cl. ........................ 523/440; 523/457; 523/468
(58) Field of Classification Search ...................... None
See application file for complete search history.

(56) References Cited

U.S. PATENT DOCUMENTS 5,916,683 A * 6/1999 Ueda et al. ................. 428/418
5,932,309 A * 8/1999 Smith et al. .................. 428/46
7,008,981 B2 * 3/2006 Liu et al. ..................... 523/442

FOREIGN PATENT DOCUMENTS

| JP | 04-218573 | * | 8/1992 |
| JP | 05-009270 | * | 1/1993 |
| JP | 06-128517 | * | 5/1994 |

OTHER PUBLICATIONS

Derwent Abstract of: JP 04-218573.*
JPO Abstract of: JP 04-218573.*
Derwent Abstract of: JP 06-128517.*
Machine translation of JP 06-128517, provided by the JPO website.*
Derwent Abstract of: JP 05-009270.*
Machine translation of JP 05-009270, provided by the JPO website.*

* cited by examiner

*Primary Examiner*—Michael J. Feely
(74) *Attorney, Agent, or Firm*—Bacon & Thomas, PLLC

(57) ABSTRACT

The present invention discloses an organic-inorganic hybrid composition with sufficient flexibility, a high dielectric constant, which can be used as a bonding layer having a high thermal stability and high dielectric constant. The composition includes a) a high Tg epoxy resin system; b) ferroelectric ceramic particles having two particle size distributions, with one of them pertaining to a nano level; c) an electrically conductive powder, such as an electrically conductive carbon black; d) at least one macromolecular flexibilizer; e) a macromolecular dispersant; and f) additives such as a diluent, an adhesive promoter, a hardener, a hardener promoter, and an organic solvent.

25 Claims, No Drawings

ORGANIC-INORGANIC HYBRID COMPOSITIONS WITH SUFFICIENT FLEXIBILITY, HIGH DIELECTRIC CONSTANT AND HIGH THERMAL STABILITY, AND CURED COMPOSITIONS THEREOF

CROSS-REFERENCE TO RELATED APPLICATION

The present application is a continuation-in-part application of U.S. patent application Ser. No. 10/742,815, filed Dec. 23, 2003, now issued as U.S. Pat. No. 7,008,981, granted Mar. 7, 2006. The above-listed application is commonly assigned with the present invention and the entire contents of which are incorporated herein by reference.

FIELD OF THE INVENTION

The present invention relates to an organic-inorganic hybrid composition with a high dielectric constant, which can be used as a bonding layer having a high flexibility, thermal stability and dielectric constant.

BACKGROUND OF THE INVENTION

US patent publication No. US2002-0048137A1 discloses a capacitor foil for making a two-layered embedded capacitor including a conductive layer and a partially cured bonding layer having a relatively high dielectric constant. The high dielectric bonding layer is formed with epoxy or other polymer and is loaded with capacitive ceramic particles. The capacitor foil may be applied to a laminate having copper patterns thereon to define a PCB intermediate containing at least one buried capacitor, each of the copper patterns defines a ground plane, and the conductive layer constitutes a power plane for the capacitor.

U.S. Pat. No. 6,274,224 discloses a passive electrical article comprising (a) a first self-supporting substrate having two opposing major surfaces, (b) a second self-supporting substrate having two opposing major surfaces, and (c) an electrically insulating or electrically conducting layer comprising a polymer between the first and second substrate. One embodiment of the passive electrical article is an embedded capacitor formed by placing a layer of a high dielectric constant ceramic dispersed in an epoxy resin between two conductive electrode sheets, e.g., barium titanate in epoxy between copper foils. One of the epoxy resins used in this prior art is a blend of a diglycidylether of bisphenol A and a novolac epoxy. The blend of barium titanate particles and epoxy may be prepared by mixing together barium titanate, a ketone solution of epoxies, and a dispersing agent, preferably an anionic dispersant, for example, a copolymer of polyester and polyamine, commercially available from ICI Americas, Wilmington, Del., under the trade designation "Hypermeer PS3". The insulating layer disclosed in this prior art can be improved in the aspects such as high dielectric property, high thermal resistance, a good bonding property.

US patent publication No. 2003/0006402 A1 discloses polymer composites and methods of making the polymer composites. A representative polymer composite includes a polymer resin and a conductive material, wherein the polymer composite is characterized by a dielectric constant greater the 200. A representative method of making the polymer composite can be broadly summarized by the following steps: providing a polymer resin and a conductive material; mixing the polymer resin and the conductive material; and forming the polymer composite, wherein the polymer composite is characterized by a dielectric constant greater than 200. The conductive material is chosen from transition metals, alloys of transition metals, carbon black, carbon fiber, and graphite. However, this polymer composite has a great dissipation factor, and in particular at 1 MHz frequency; moreover, the dissipation factor is very sensitive to the frequency. As a result, the potential of this polymer composite in industrial applications is adversely affected. This prior art is lack of description relating to the thermal stability, bonding and processing properties of the polymer composite.

SUMMARY OF THE INVENTION

The present invention is emphasized in providing a technique in formulating a hybrid material from a polymeric resin and a ceramic powder. Said material posses a high dielectric property, a high thermal resistance, a good bonding property, and an excellent processing property (flexibility), etc.

The present invention discloses a material formulation technique that has not been disclosed in the prior art and is rather important, in order to resolve the problems possibly occurred in an epoxy/ferroelectric ceramic powder hybrid, such as thermal resistance, brittleness of substrate, bonding strength to copper foils, and processing compatibility with the conventional PCB process, etc. The measures adopted include: (1) selecting a suitable epoxy composition to balance the thermal resistance and the bonding property at the same time; (2) adding a ferroelectric ceramic powder having two particle size distributions, with one of them pertaining to a nano level, into an epoxy resin to increase the dielectric constant of the hybrid while ensuring a high dielectric constant and a good flow property during processing, in order to ensure the quality of the substrate material; (3) adding conductive powder (modified carbon black with functionalities on the surface thereof), at least part of which is reacted with the epoxy resin, forming carbon black embedded with epoxy resin to lower the dissipation factor; (4) selecting a suitable macromolecular dispersant in order to improve the poor thermal resistance of a low molecular dispersant, and particularly, the solderability resistance of a substrate, and on the other hand greatly improve the reliability of the product in the downstream applications, which mainly comprises using a special macromolecular dispersant to easily adhere to the surface of the inorganic powder, which has an excellent compatibility, and even a slight reactivity, with the organic resin to effectively resolve the drawbacks of a low molecular dispersant; (5) adding a suitable flexibilizer to resolve the drawback of poor processability due to the substrate being too brittle caused by an excessive amount of the ceramic powder (in order to effectively increase the dielectric constant); and (6) adding other additives to solve the viscosity problem or further increase the bonding property, when necessary. The resulting ferroelectric hybrid can be made into a bonding layer having a high glass transition temperature (Tg>180° C.) and an excellent adhesion (>5 lb/in) with a copper foil by the conventional fiber glass cloth impregnating technique, a precision coating technique, or a screen printing technique. An embedded capacitor made according to the present invention has a dielectric constant of 30~150 at 1 MHz and a dissipation factor of 0.02~0.07.

An organic-inorganic hybrid composition according to the present invention comprises:

a) a high Tg epoxy resin system comprising an epoxy resin with the following structure:

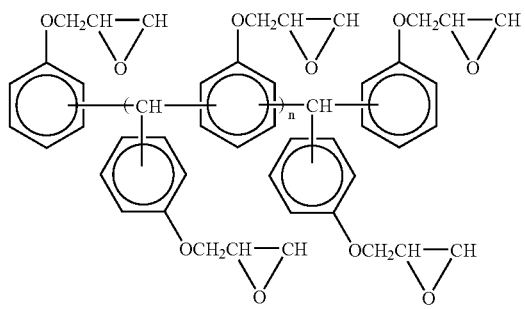

wherein n is 0-10;

b) ferroelectric ceramic particles having two or more particle size distributions, wherein a first particle size distribution is 1-100 nm, and a second particle size distribution is 300 nm-5 μm; and c) an electrically conductive powder.

Preferably, said electrically conductive powder is a transition metal, alloy of transition metals, carbon black, carbon fiber, or graphite, and the content of said electrically conductive powder is 0.01-20%, based on the weight of the solid content of organic-inorganic hybrid composition. More preferably, said electrically conductive powder is carbon black, and most preferably said electrically conductive powder comprises electrically conductive carbon black, and modified carbon black with hydroxyl or carboxyl groups on the surface of grains thereof.

Preferably, said ferroelectric ceramic particles have two dominant particle size distributions, wherein said first particle size distribution is 50-100 nm, and said second particle size distribution is 0.3-5 μm, and the ferroelectric ceramic particle with the first particle size distribution constitute 1~40 wt % of the total ferroelectric ceramic particles.

Preferably, said ferroelectric ceramic particles constitute 50-95 wt % of the total solid content of said composition.

Preferably, said ferroelectric ceramic particles are $BaTiO_3$, $SrTiO_3$, $Ba(Sr)TiO_3$, or any one of them implanted with metal ions.

Preferably, said epoxy resin system further comprises one or more epoxy resins selected from the group consisting of bisphenol A epoxy resin, cycloaliphatic epoxy resin, naphthalene epoxy resin, diphenylene epoxy resin, and phenolic novolac epoxy resin.

Preferably, said epoxy resin system further comprises a macromolecular dispersant. More preferably, said macromolecular dispersant is selected from the group consisting of polyester, polyamide, and copolymers thereof, wherein said macromolecular dispersant constitutes 0.1~5.0 wt % of the total solid content of said composition.

Preferably, said epoxy resin system further comprises a macromolecular flexibilizer. More preferably, said macromolecular flexibilizer is selected from the group consisting of polyester, polyamide, polyamide-imide, polyvinyl butyral, synthetic rubber, polycaprolactone, and aliphatic epoxy resin, and wherein said macromolecular flexibilizer constitutes 0.5~20 wt % of the total solid content of said composition.

Preferably, said epoxy resin system further comprises a diluent or an adhesion promoter. More preferably, said diluent or said adhesion promoter is:

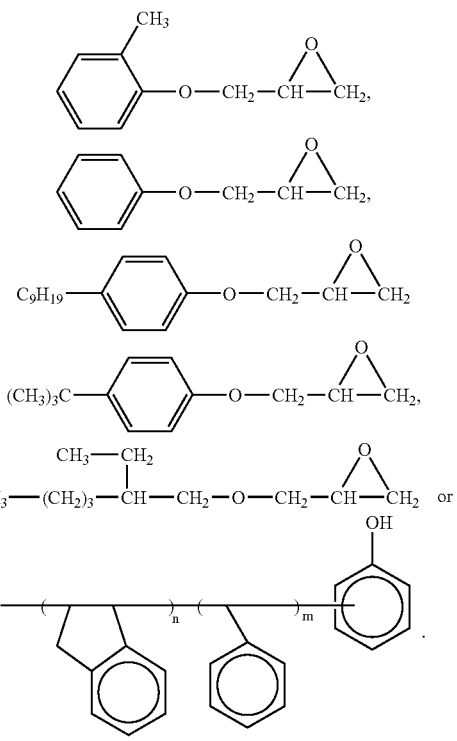

Preferably, said epoxy resin system further comprises a hardener selected from the group consisting of polyamine, phenol resin, and acid anhydride. Preferably, the hardener is used in an equivalent amount with said epoxy resin system in term of active functionalities of them.

Preferably, said epoxy resin system further comprises a hardener promoter. Preferably, the content of the hardener promoter is 0.01-5%, based on the weight of the hardener.

Preferably, said epoxy resin system further comprises a silane coupling agent to enhance the dispersion and compatibility of said ferroelectric ceramic particles in said composition. More preferably, said silane coupling agent is epoxysilane or aminosilane.

Preferably, said epoxy resin system further comprises a catalyst. More preferably, said catalyst is phenyl phosphine, and the content of the catalyst is 0.01-5%, based on the total weight of the epoxy resin system.

Preferably, said epoxy resin system further comprises an organic solvent.

The present invention also discloses a cured organic-inorganic hybrid material, which is cured from the composition of the present invention. Preferably, said curing is carried out by heating said composition. More preferably, said heating is carried out at 160~200° C. for 2~6 hours. Preferably, said epoxy resin system containing said catalyst is reacted with said modified carbon black at 100~130° C. for 3-6 hours prior to said curing.

DETAILED DESCRIPTION OF THE PREFERRED EMBODIMENTS

One objective of the present invention is to produce a substrate material having a high dielectric constant, a low dissipation factor, and a high thermal resistance (high Tg), which can be applied in the manufacture of high frequency, high speed communication and information products, including embedded capacitances. The material used comprises: a) a high Tg epoxy resin system; b) ferroelectric ceramic particles having two or more particle size distributions, with one of them pertaining to a nano level; c) one or more than one type of carbon black including electrically conductive carbon black, and modified carbon black with hydroxyl (—OH) or carboxyl (—COOH) groups on the surface of the carbon black; d) at least one macromolecular flexibilizer; e) a macromolecular dispersant; and f) additives such as a diluent, an adhesion promoter, a catalyst, and an organic solvent.

A suitable process for preparing the substrate material of the present invention comprises:

1. loading an epoxy resin and a solvent in a reactor, heating the mixture to 90~95° C. to completely dissolve the epoxy resin; allowing the resulting solution to cool down;

2. to the solution adding a suitable amount of carbon black powder, stirring the mixture at a high speed to disperse the carbon black powder, adding a catalyst to the dispersion, and heating the resulting mixture at 100-130° C. for 3-6 hours;

3. to the mixture adding a suitable amount of a hardener and a hardener promoter and, after a complete dissolution of the hardener and hardener promoter, adding a suitable amount of a dispersant, a flexibilizer, and other additives;

4. adding a suitable amount of ferroelectric particles having two or more particle size distributions into the mixture, stirring the mixture at a high speed, wherein said ferroelectric particles comprise about 20~70 vol % or 50-95 wt % of the total solid content, and the ratio of the large particles (0.3~5 μm) to the small particles (<100 nm) is 100:1~60:40;

5. blending the resulting organic-inorganic mixture in a ball mill for 12~36 hours to obtain a well dispersed hybrid coating solution;

6. fabricating a substrate by using the resulting coating solution for measurement of electrical properties via the following fabrication methods:

(1) a fiber glass cloth impregnating process: preparing a prepreg of the fiber glass cloth and the coating solution; and performing a lamination process at 200° C. for about 3 hours to obtain a copper foil substrate;

(2) a precision coating process: preparing a resin coated copper (RCC); and laminating the resulting RCC with a copper foil to form a copper foil substrate;

(3) using a screen printing process to print a coating solution on a substrate; and laminating a metal layer or performing a high temperature curing, followed by plating a metal layer, thereby forming a substrate having upper and lower electrodes;

7. The resulting substrates, after being measured for their electrical properties, have a dielectric constant of about 30~150 at 1 MHz and a dissipation factor of about 0.02~0.07 depending on the materials used.

8. Regarding the thermal properties, the substrates pass a 288° C. solder resistance test, and have a Tg of 170~230° C.

Typical raw materials used by the present invention include:

Epoxy resin

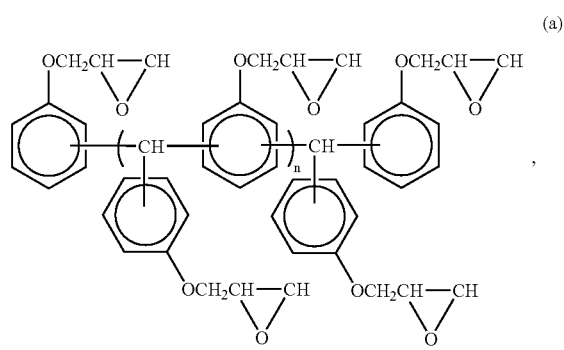

(a)

wherein n is 0-10;

(b) Diglycidyl ether of bisphenol A epoxy (c) Tetrabromo bisphenol A diglycidyl ether epoxy (d) Cycloaliphatic epoxy resin for example, dicyclopentadiene epoxy resin (e) Naphthalene epoxy resin (f) Diphenylene epoxy resin (g) Phenolic novolac epoxy resin (h) o-Cresol novolac epoxy resin)

Hardener (a) diamine: $H_2N—R_1—NH_2$ $R_1$ is aryl, aliphatic, cycloaliphatic or silane-containing aliphatic, e.g.

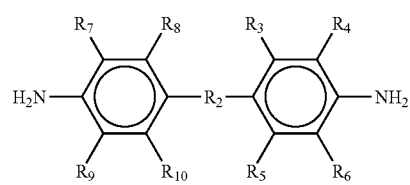

$R_2$:—, $CH_2$, $SO_2$, O, S, or $C(CH_3)_2$ $R_3$~$R_{10}$: H, $CH_3$, $C_2H_5$, $C_3H_7$, or $C(CH_3)_3$ (b) phenol resin Phenolic resin e.g.

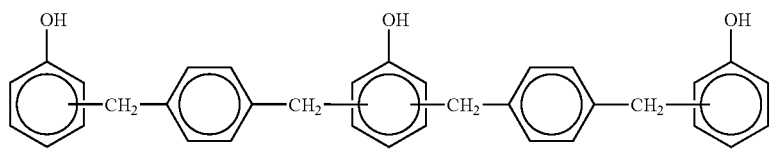

Naphthol based resin e.g.
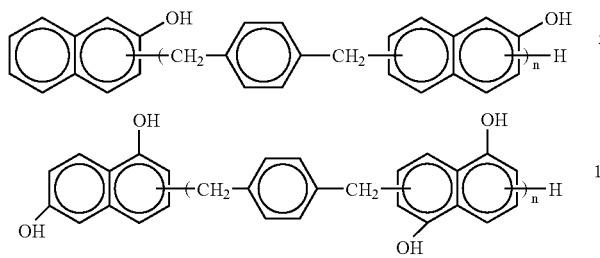
Terpene phenol resin
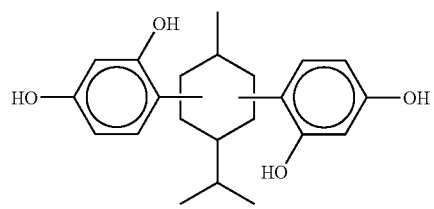
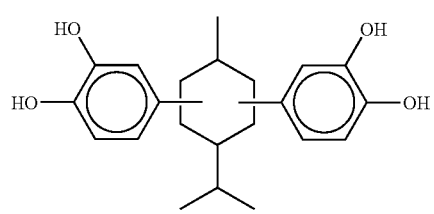
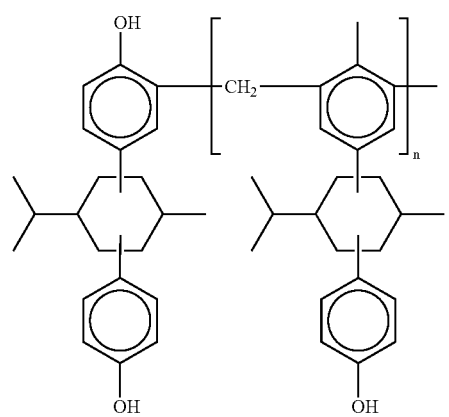
Dicyclopentadiene resin
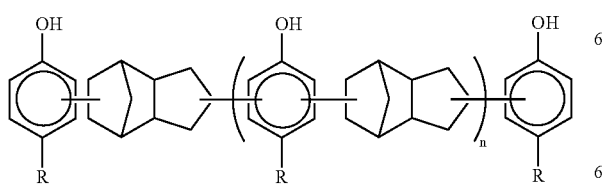
4,4',4''-Ethylidene trisphenol
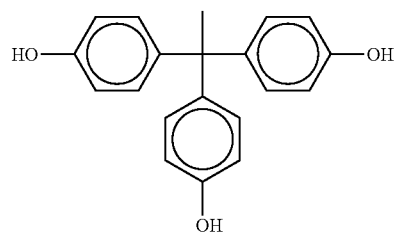
Tetra phenylolethane
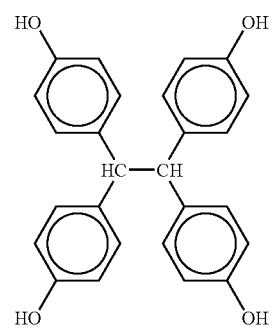
Tetraxylenol ethane
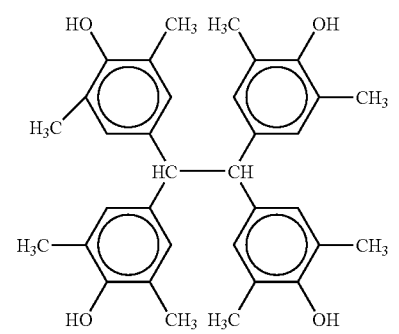
Tetracresololethane
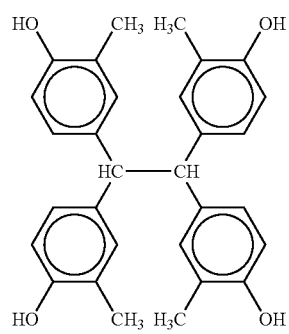

Hardener promoter (a) Cationic catalyst

Trifluoro borate complex, such as $RNH_2.BF_3$, $R_2NH.BF_3$, and $R_3N.BF_3$, wherein R is aryl, aliphatic, or cycloaliphatic;

(b) Anionic catalyst

Tetiary amine, and coordinated anionic catalyst of metal hydroxide and monocyclic oxide, such as $R_3N$, $NCH_2C-C(NH)-N(CH_3)_2$, etc. wherein R is aryl, aliphatic, or cycloaliphatic;

(c) Imidazole 1-methylimidazole 1,2-dimethylimidazole 2-heptadecyclimidazole 2-ethyl-4-methylimidazole Catalyst Phenylphosphines such as triphenylphosphine Carbon black 1. Electrically conductive carbon black;
2. Modified carbon black with hydroxyl (—OH) or carboxyl (—COOH) groups on the surface of the carbon black Inorganic filler Mainly ferroelectric ceramic powder with a high dielectric constant, such as $BaTiO_3$, $SrTiO_3$, $Ba(Sr)TiO_3$, and $BaTiO_3$ and $SrZrO_3$ implanted with metal ions;

Flexibilizer

Flexibilizers applicable in the present invention include: polyester, polyamide, polyamide-imide, polyvinyl butyral, synthetic rubber (e.g. carboxyl-terminated butadiene acrylonitrile, CTBN), polycaprolactone, $(R-[-O[-CO(CH_2)_5-O-]_n-]_f)$, aliphatic epoxy resin having the following structures:

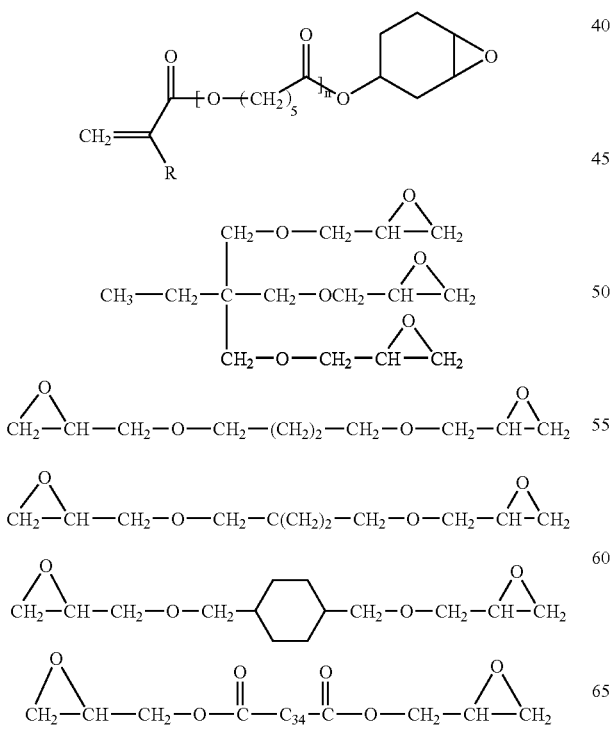

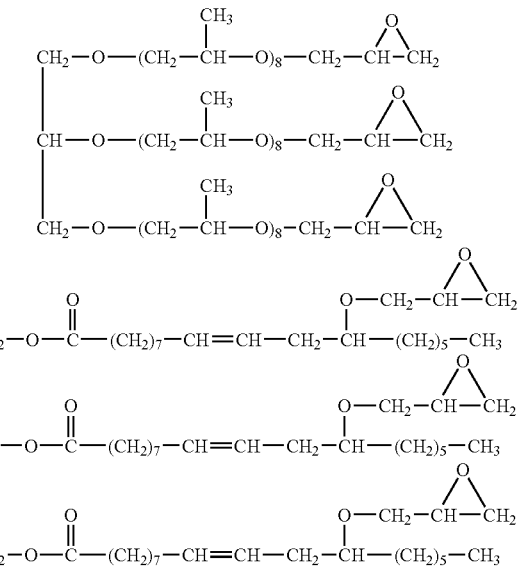

The structural differences of abovementioned flixibilizers impart a different reactivity and a different compatibility to a resin system, thereby generating a different softening effect. Therefore, a mixture of the flexibilizers can be used to achieve the objective of softening in order to take into consideration both the processing property in production and the heat resistance (including solder resistance and Tg temperature) of the final copper foil substrate.

Dispersant

The present invention adopts a macromolecular dispersant for its good adhesion with an inorganic powder, and its excellent compatibility and slight reactivity with an organic resin, thereby greatly increasing the heat resistance and reliability of the substrate. Applicable macromolecular dispersants include polyester-amide, polyester, or polyamide, etc.

Other additives

Diluent and adhesion promoter

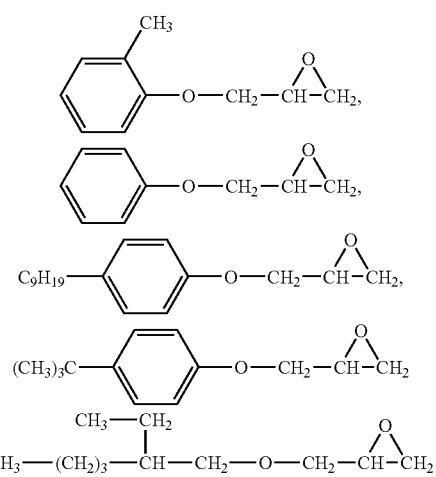

-continued

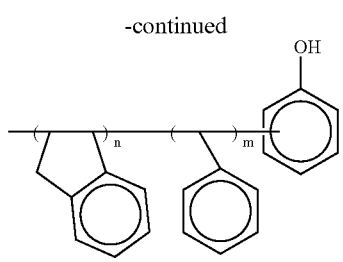

Silane Coupling agent, such as epoxysilane and aminosilane.

The present invention will be further elaborated by way of the following examples, which are for descriptions only and not for limiting the scope of the present invention.

EXAMPLES AND CONTROLS

Different materials were used as shown in Table 1. Suitable amounts of epoxy resins including bisphenol-A diglycidyl ether (Epoxy 1) (code: 188EL, CHANG CHUN PLASTICS CO., LTD., Taiwan), tetrabromo bisphenol-A diglcidyl ether (Epoxy2) (code: BEB-350, CHANG CHUN PLASTICS CO., LTD., Taiwan), cycloaliphatic epoxy (Epoxy 3) (code: HP-7200, DIC Corp., Japan), and multifunctional epoxy (Epoxy 4) (abovementioned epoxy resin (a), purchased from NIPPON CHEMICALS CO., LTD.) were added into a reactor. A suitable amount of dimethylformamide (DMF) was added and the mixture was heated to 90° C. ~95° C. in order to fully dissolve the epoxy resins. A suitable amount of carbon black powder mixture (code: XE-2B, Degussa Co., and code: M800, Cabot Co., in a ratio of 1:1) was added to the solution, and the resulting mixture was stirred at a high speed to disperse the carbon black powder mixture. To the dispersion 0.1% triphenylphosphine was added, based on the weight of the dispersion, and heated to 105° C. for four hours. A suitable amount of a hardener, 4,4'-methylenedianiline (ACROS Corp., U.S.A.) and a suitable amount of a hardener promoter, 2-ethyl-4-methylimidazole (ACROS Corp., U.S.A.) were added. When the hardener and hardener promoter were fully dissolved in the epoxy resin solution, a suitable amount of a macromolecular type dispersant, Hypermer (Uniquema Corp., U.S.A.), and various flexibilizers such as polyvinly butyral (PVB, CHANG CHUN PLASTICS CO., LTD., Taiwan) (Flexibilizer 1), and CTBN (ZEON Chemical Corp., U.S.A.) (Flexibilizer 2) were added. Until the additives were fully dissolved, the temperature of the mixture was reduced to room temperature. Next, a suitable amount of a ferroelectric filler having two majort particle size distributions (e.g. $BaTiO_3$ A: $BaTiO_3$ average particle size 0.8 μm; $BaTiO_3$ B: $BaTiO_3$ average particle size 60 nm) was added, and the mixture was intensively stirred at a high speed to form a resin/$BaTiO_3$/carbon black hybrid solution.

The hybrid solutions of Controls 1, 2, 3 and 5 in Table 1 were prepared according to the procedures for preparing the hybrid solutions of Example 1 and Example 2, except that the formulations are different. The hybrid solution of Control 4 were prepared according to the formula in Table 1 and the procedures for preparing the hybrid solutions of Example 1 and Example 2, except that the carbon black dispersion in Control 4 was not subjected to the four hours' heating at 105° C.

Different resin/$BaTiO_3$/carbon black hybrid solutions prepared according to Table 1 were separately dispersed by a ball mill. The resulting organic/inorganic hybrid solutions were separately coated on a copper foil by a scraper, and heated by baking to remove the solvent (100° C., 3 hr) and partially cure the coating to form a so-called RCC (Resin Coated Copper). These RCCs were separately laminated with a copper foil and cured under high pressure and high temperature (lamination temperature of about 200° C. for 2.5 hours) to form organic/inorganic hybrid copper foil substrate materials. These substrate materials were separately tested for their physical properties. The results are listed in Table 2.

TABLE 1

| Composition | Control 1 | Control 2 | Control 3 | Control 4 | Control 5 | Example 1 | Example 2 |
|---|---|---|---|---|---|---|---|
| Epoxy 1 (g) | 7.22 | 6.63 | 7.73 | 8.28 | 8.90 | 8.28 | 8.00 |
| Epoxy 2 (g) | 5.18 | 4.95 | 5.77 | 6.18 | 6.80 | 6.18 | 5.97 |
| Epoxy 3 (g) | 1.05 | 1.04 | 1.21 | 1.30 | 1.92 | 1.30 | 1.26 |
| Epoxy 4 (g) | 1.50 | 1.50 | 1.75 | 1.88 | 0 | 1.88 | 1.82 |
| Hardener (g) | 3.78 | 3.42 | 3.99 | 4.28 | 4.1 | 4.28 | 4.14 |
| Hardener promoter (g) | 0.06 | 0.06 | 0.06 | 0.07 | 0.07 | 0.07 | 0.07 |
| Dispersant (g) | 3.60 | 3.61 | 4.20 | 4.50 | 4.50 | 4.50 | 4.32 |
| Carbon black (g) | 0 | 0 | 0 | 0.88 | 0 | 0.88 | 1.71 |
| Flexibilizer 1 (g) | 0 | 0 | 0 | 1.50 | 1.50 | 1.50 | 0 |
| Flexibilizer 2 (g) | 0 | 1.00 | 1.41 | 0 | 0 | 0 | 1.45 |
| $BaTiO_3$ A (g) | 120.00 | 120.00 | 120.00 | 128.56 | 128.45 | 128.56 | 124.28 |
| $BaTiO_3$ B (g) | 0 | 0 | 20.00 | 21.43 | 21.41 | 21.43 | 20.72 |

TABLE 2

| Property | Control 1 | Control 2 | Control 3 | Control 4 | Control 5 | Example 1 | Example 2 |
|---|---|---|---|---|---|---|---|
| Tg (° C.) | 203 | 197 | 189 | 186 | 158 | 192 | 189 |
| Dielectric constant (1 Mz) | 30.02 | 33.12 | 35.53 | 118.52 | 37.62 | 58.86 | 102.65 |
| Dissipation factor (1 Mz) | 0.0232 | 0.0243 | 0.0252 | 0.152 | 0.0262 | 0.0287 | 0.042 |
| Peeling strength[a] (lb/in) | 2.2 | 3.6 | 5.2 | 4.1 | 5.8 | 5.3 | 4.8 |

TABLE 2-continued

| Property | Control 1 | Control 2 | Control 3 | Control 4 | Control 5 | Example 1 | Example 2 |
|---|---|---|---|---|---|---|---|
| Flexibility[b)] | poor | excellent | excellent | excellent | excellent | excellent | excellent |
| PCB Processibility[c)] | brittle | good | good | good | good | good | good |
| Soldering resistance[d)] | not tested | fail | pass | fail | pass | pass | pass |

[a)]The peeling strength was tested according to IPC-650.
[b)]The flexibility was tested according to IPC-650.
[c)]Current organic PCB process.
[d)]The soldering resistance test was carried out by heating at 2 atm and 110° C. for 2 hours, followed by at 288° C. for 3 minutes.

Control 1 and 2 use $BaTiO_3$ with single particle size distribution free from $BaTiO_3$ nano powder. Under the same $BaTiO_3$ ratio, their processability and peeling strength are poor; however, if a suitable amount of a flexibilizer (Control 2) is added, the flexibility and processibility thereof can be improved, while the peeling strength remains poor which is mainly caused by an insufficient flow of the viscous varnish. The addition of nano size $BaTiO_3$ can increase the packing density of $BaTiO_3$, the dielectric constant, peeling strength, and soldering resistance, as shown by Controls 2 and 3. An important factor for a high Tg is the selection of the epoxy resin system. In principle, the incorporation of the multi-functional epoxy resin can greatly increase Tg. Further, the dissipation factor of Control 4 is much higher than that of Examples 1 and 2, this is because the carbon black powder in Control 4 does not react with the epoxy resins prior to curing the epoxy resin system.

The above results indicated that in order to obtain a good processibility organic-inorganic hybrid composition with a high dielectric constant and a high thermal stability, the formula needs to include a high Tg epoxy resin system, carbon black, coupling of carbon black powder and the epoxy resins, a suitable flexibilizer, a macromolecular flexibilizer, and ferroelectric ceramic particles having at least two particle size distributions, with one of them pertaining to a nano level, thereby a substrate material with a high dielectric constant and application potential can be prepared.

The present invention has been above disclosed. A person skilled in the arts could alter and modify the present invention without depart from the scope of the present invention defined in the following claims.

The invention claimed is:

1. An organic-inorganic hybrid composition, which comprises:
   a) a high Tg epoxy resin system comprising an epoxy resin with the following structure:

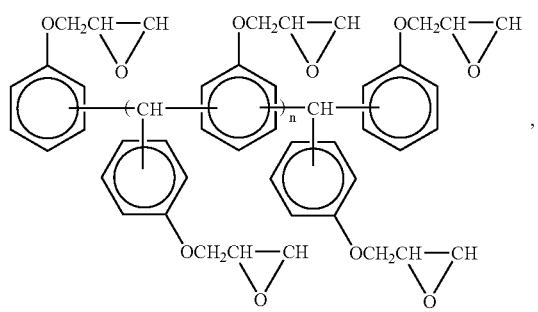

wherein n is 0-10;
   b) ferroelectric ceramic particles having two or more particle size distributions, wherein a first particle size distribution is 1-100 nm, and a second particle size distribution is 300 nm-5 μm; and
   c) an electrically conductive powder.

2. The composition as claimed in claim 1, wherein said ferroelectric ceramic particles have two dominant particle size distributions, wherein said first particle size distribution is 50-100 nm, and said second particle size distribution is 0.3-5 μm, and the ferroelectric ceramic particles with the first particle size distribution constitute 1~40 wt % of the total ferroelectric ceramic particles.

3. The composition as claimed in claim 1, wherein said ferroelectric ceramic particles constitute 50-95 wt % of the total solid content of said composition.

4. The composition as claimed in claim 1, wherein said ferroelectric ceramic particles are $BaTiO_3$, $SrTiO_3$, $Ba(Sr)TiO_3$, or any one of them implanted with metal ions.

5. The composition as claimed in claim 1, wherein said epoxy resin system further comprises one or more epoxy resins selected from the group consisting of bisphenol A epoxy resin, cycloaliphatic epoxy resin, naphthalene epoxy resin, diphenylene epoxy resin, and phenolic novolac epoxy resin.

6. The composition as claimed in claim 1, wherein said electrically conductive powder comprises a transition metal powder, powder of an alloy of transition metals, carbon black powder, or carbon fiber, and said composition comprises 0.01-20% of said electrically conductive powder, based on the weight of a solid content of said composition.

7. The composition as claimed in claim 6, wherein said electrically conductive powder is carbon black powder.

8. The composition as claimed in claim 7, wherein said electrically conductive powder comprises an electrically conductive carbon black powder, and a modified carbon black powder with hydroxyl or carboxyl groups on the surfaces of grains thereof.

9. The composition as claimed in claim 8, wherein said epoxy resin system further comprises a macromolecular dispersant.

10. The composition as claimed in claim 9, wherein said macromolecular dispersant is selected from the group consisting of polyester, polyamide, and copolymers thereof, wherein said macromolecular dispersant constitutes 0.1~5.0 wt % of the total solid content of said composition.

11. The composition as claimed in claim 9, wherein said epoxy resin system further comprises a macromolecular flexibilizer.

12. The composition as claimed in claim 11, wherein said epoxy resin system further comprises a diluent or an adhesion promoter.

13. The composition as claimed in claim 12, wherein said diluent or said adhesion promoter is:

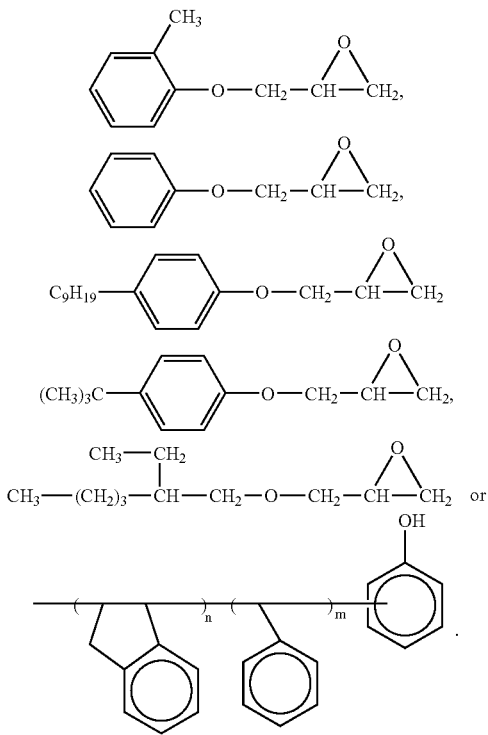

14. The composition as claimed in claim 11, wherein said epoxy resin system further comprises a hardener selected from the group consisting of polyamine, phenol resin, and acid anhydride.

15. The composition as claimed in claim 14, wherein said epoxy resin system further comprises 0.01-5% of a hardener promoter, based on the weight of the hardener, and said hardener is used in an equivalent amount with said epoxy resin system in term of active functionalities of them.

16. The composition as claimed in claim 14, wherein said epoxy resin system further comprises phenyl phosphine as a catalyst, said catalyst is in an amount of 0.01-5%, based on the total weight of the epoxy resin system.

17. A cured organic-inorganic hybrid material, which is cured from said composition claimed in claim 16.

18. The cured organic-inorganic hybrid material as claimed in claim 17, wherein said curing is carried out by heating said composition.

19. The cured organic-inorganic hybrid material as claimed in claim 18, wherein said heating is carried out at 160-200° C. for 2-6 hours.

20. The cured organic-inorganic hybrid material as claimed in claim 17, wherein said epoxy resin system containing said catalyst is reacted with said modified carbon black powder at 100-13° C. for 3-6 hours prior to said curing.

21. The cured organic-inorganic hybrid material as claimed in claim 18, which has a dielectric constant of about 30~150 at 1 MHz and a dissipation factor of about 0.02~0.07, and has a glass transition temperature of 170~230° C.

22. The composition as claimed in claim 11, wherein said macromolecular flexibilizer is selected from the group consisting of polyester, polyamide, polyamide-imide, polyvinyl butyral, synthetic rubber, polycaprolactone, and aliphatic epoxy resin, and wherein said macromolecular flexibilizer constitutes 0.5~20 wt % of the total solid content of said composition.

23. The composition as claimed in claim 11, wherein said epoxy resin system further comprises a silane coupling agent to enhance the dispersion and compatibility of said ferroelectric ceramic particles in said composition.

24. The composition as claimed in claim 23, wherein said silane coupling agent is epoxysilane or aminosilane.

25. The composition as claimed in claim 11, wherein said epoxy resin system further comprises an organic solvent.

* * * * *